(12) United States Patent
Lin

(10) Patent No.: US 6,735,076 B2
(45) Date of Patent: May 11, 2004

(54) RADIATION APPARATUS

(75) Inventor: Shu Ju Lin, Taipei (TW)

(73) Assignee: Inventec Corporation, Taipei (TW)

( * ) Notice: Subject to any disclaimer, the term of this patent is extended or adjusted under 35 U.S.C. 154(b) by 48 days.

(21) Appl. No.: 10/153,667

(22) Filed: May 24, 2002

(65) Prior Publication Data

US 2003/0218864 A1 Nov. 27, 2003

(51) Int. Cl.[7] ................................. G06F 1/16
(52) U.S. Cl. ................ 361/687; 361/696; 165/121; 174/16.3
(58) Field of Search ................ 361/687, 679, 361/680–686, 724–727, 694–696, 704, 707; 165/80.2, 80.3, 185, 121–122; 174/16.3

(56) References Cited

U.S. PATENT DOCUMENTS 5,236,306 A * 8/1993 Hozak ..................... 416/93 R
5,864,465 A * 1/1999 Liu ........................... 361/697
6,288,898 B1 * 9/2001 Johnson et al. ............. 361/687
6,359,779 B1 * 3/2002 Frank et al. ................ 361/687

* cited by examiner

*Primary Examiner*—Hung Van Duong
(74) *Attorney, Agent, or Firm*—Jacobson Holman PLLC

(57) ABSTRACT

A radiation apparatus for dispersing heat generated by a processor of an electronic device includes a radiator bonded to the processor and an axial fan for drawing external air into the casing. The axial fan has a nose-shaped spindle with a nose tip close to the radiator to evenly channel the wind generated by the rotating axial fan to the radiator to disperse heat. Reverse air flow is prevented at the air exit of the rotating axial fan spindle.

6 Claims, 7 Drawing Sheets

RADIATION APPARATUS

FIELD OF THE INVENTION

The invention relates to a radiation apparatus for electronic devices and particularly to a radiation apparatus that has an axial fan with a nose-shaped spindle for guiding wind direction.

BACKGROUND OF THE INVENTION

A conventional axial fan 10, as shown in FIG. 1, has a spindle 11. Because of this spindle 11, when the axial fan 10 rotates, the wind being generated forms a low pressure zone at the air exit of the spindle 11 and results in reverse or counter air flow.

The reverse air flow (or counter air flow) incurred at the air exit of the spindle 11 causes the wind to flow unevenly through the radiation fins 21 of the radiator 20 (as shown in FIG. 2A) of electronic devices. As a result, heat dissipation for these devices is ineffective. In order to prevent the aforesaid problem from taking place, many electronic devices (such as servers, workstations, notebook computers and desktop computers, etc.) have increased the distance between the axial fan 10 and the radiator 20 (from a smaller distance L1 to a greater distance L2, as shown in FIG. 2B). While such an arrangement enables the wind generated by the axial fan 10 to flow evenly through the radiation fins 21 of the radiator, 20 and reduce the impact caused by the reverse air flow (or counter air flow) and improve radiation effect, it increases the size of the devices and cannot meet the prevailing thin and light requirement for electronic devices.

In view of the aforesaid disadvantages, it is necessary to develop a radiation apparatus to overcome the problems caused by the reverse air flow (or counter air flow), improve the radiation effectiveness for electronic devices, and to shorten the distance between the axial fan and the radiator to reduce the size of the radiation apparatus and meet the thin and light design requirements.

SUMMARY OF THE INVENTION

The primary object of the invention is to provide a radiation apparatus for improving the radiation deficiency resulting from reverse air flow (or counter air flow) at the air exit of the axial fan spindle in electronic devices and to decrease the distance between the axial fan and the radiator in order to reduce the size of the radiator.

The radiation apparatus of the invention includes a radiator and an axial fan. The radiator is bonded to the processor of an electronic device for dispersing heat generated by the processor. The radiator has a plurality of radiation fins that have one end facing the axial fan 10 and the other end opposing the axial fan 10. The axial fan is located on one side of the radiator for drawing external air into the device to dissipate heat from the interior of the device. The axial fan ha a nose-shaped spindle tip with the nose tip close to the radiator. When the axial fan rotates, wind flows evenly along the nose-shaped tip of the spindle to the radiator.

When in use, the rotating axial fan draws external air into the casing for dispersing heat from the interior of the casing. Wind flows evenly along the nose-shaped spindle to the radiator. Thus the wind flows through the radiation fins to carry the heat generated by the processor away and achieve the radiation effect.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
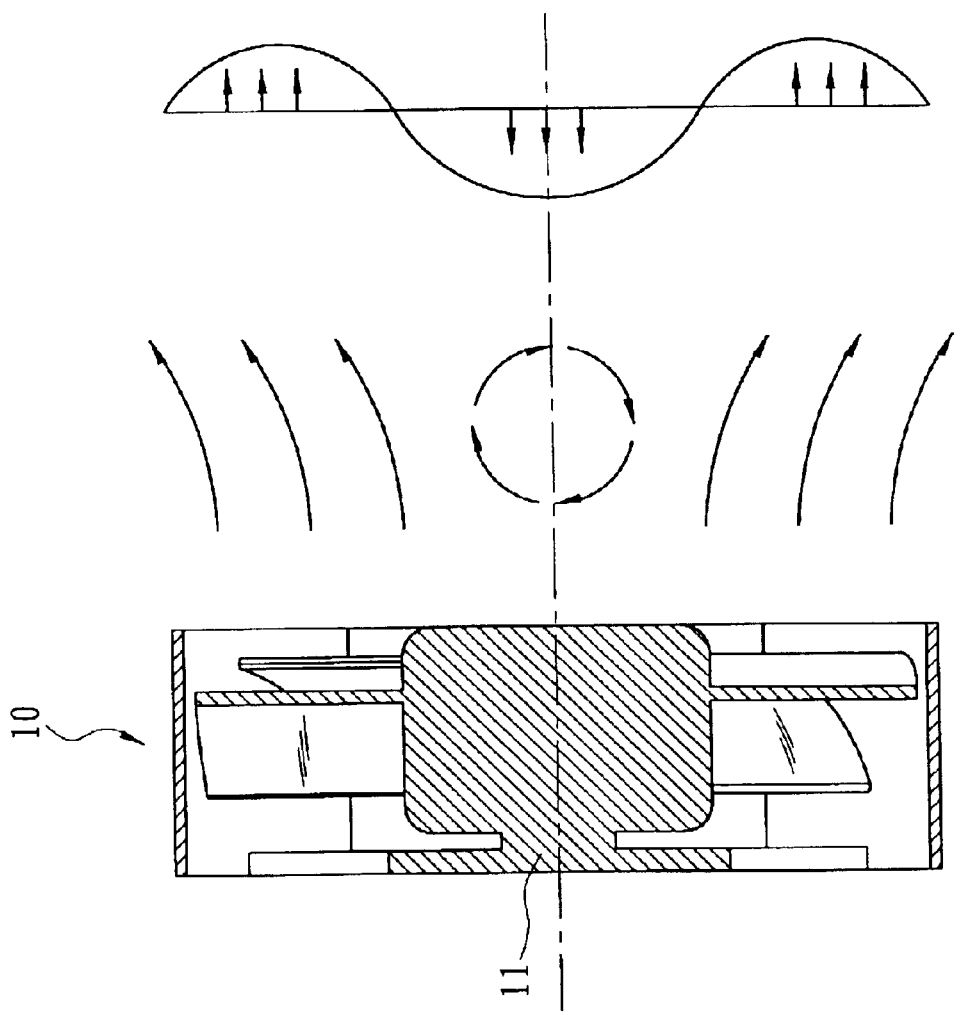
FIG. 1 is a schematic view of reverse air flow at the spindle air exit of a conventional axial fan.
Figure 2A:
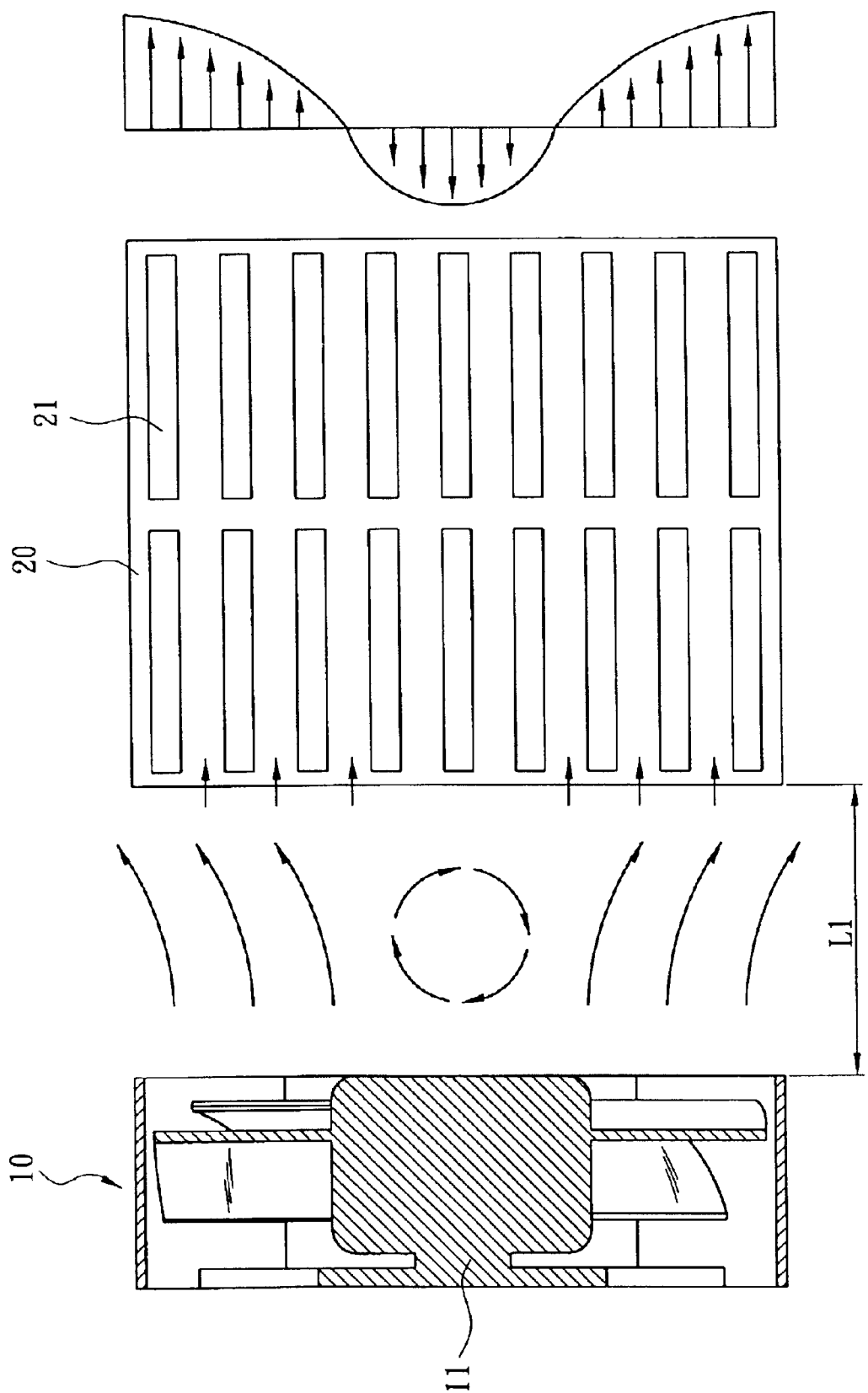
FIG. 2A is a schematic view of heat dissipation of a conventional axial fan with a short distance from the radiator.
Figure 2B:
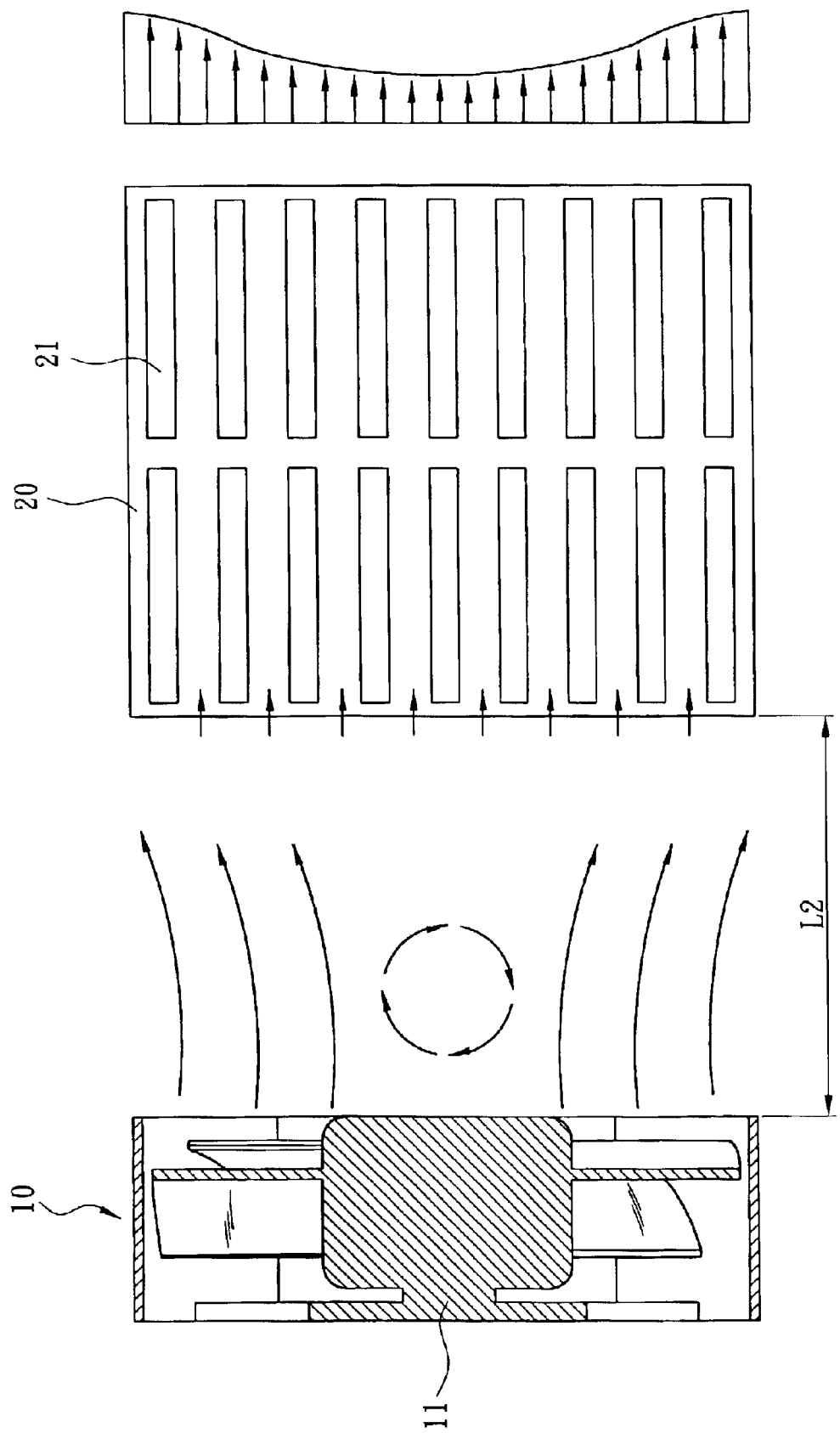
FIG. 2B is a schematic view of heat dissipation of a conventional axial fan with a long distance from the radiator.
Figure 3:
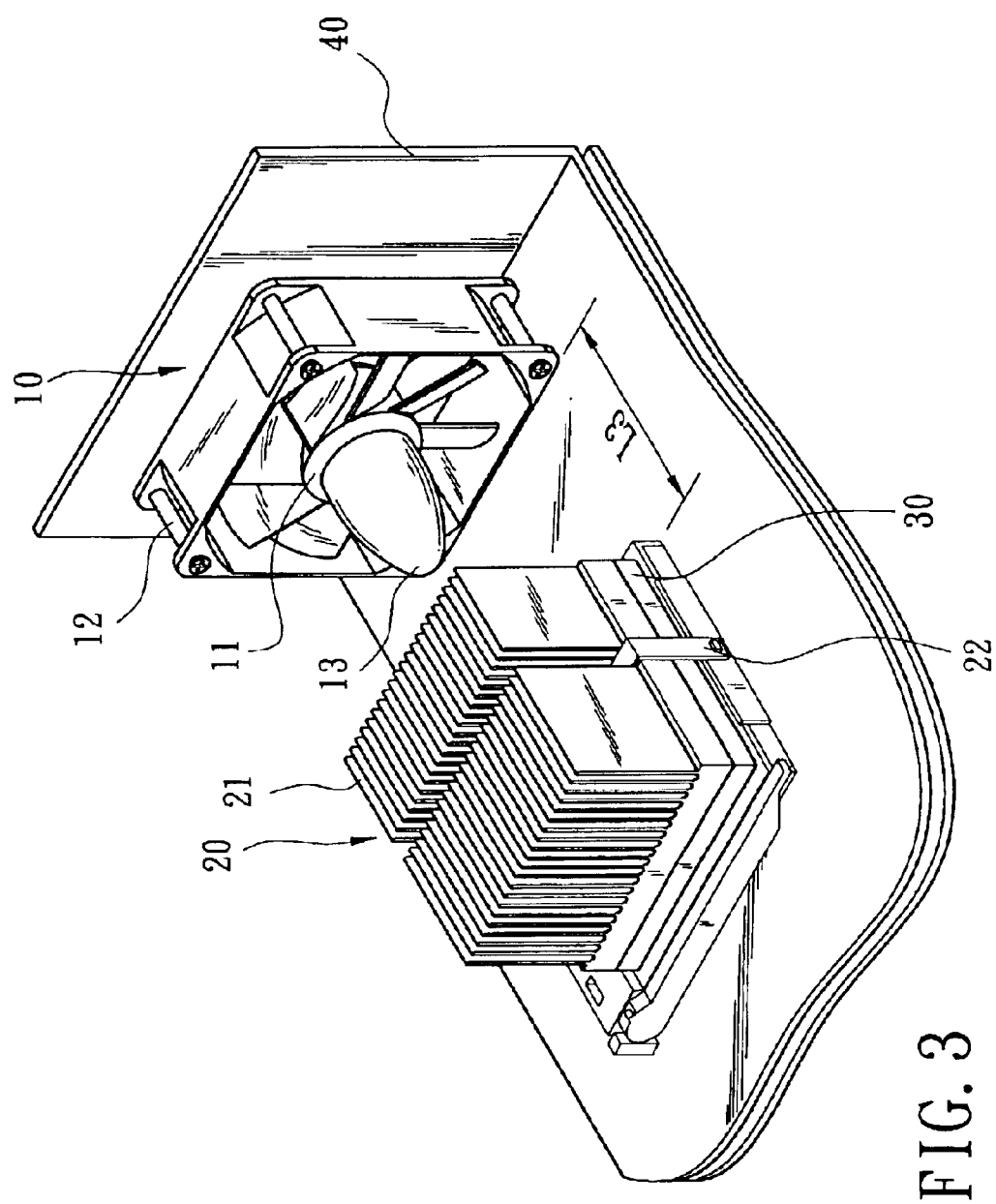
FIG. 3 is a perspective view of the invention.

Referring to FIG. 3, the radiation apparatus of the invention aims at dispersing heat generated by an electronic device without being hindered by the reverse air flow (or counter air flow) caused by the rotation of the axial fan 10, thus increasing radiation efficiency. In addition, the radiator 20.and the axial fan 10 of the invention are spaced at a shorter distance L3 from one another, so the radiation apparatus may be smaller and the electronic device leaner and lighter.

The invention includes a radiator 20 and an axial fan 10 spaced at a distance L3 from each other. The radiator 20 is closely anchored on a processor 30 of an electronic device by means of a coupling element 22 for dispersing heat generated by the processor 30. The radiator 20 has a plurality of radiation fins 21. The radiation fins 21 has one end facing the axial fan 10 and the other end opposing the axial fan 10.

The axial fan 10 is mounted to a casing 40 of the electronic device through a plurality of fasteners 12 for drawing external air into the device to disperse heat. The axial fan 10 has a nose-shaped spindle, which has a spindle tip 13 close to the radiator 20. When the axial fan 10 rotates, wind flows evenly along the nose-shaped spindle to the radiator 20.

Figure 4:
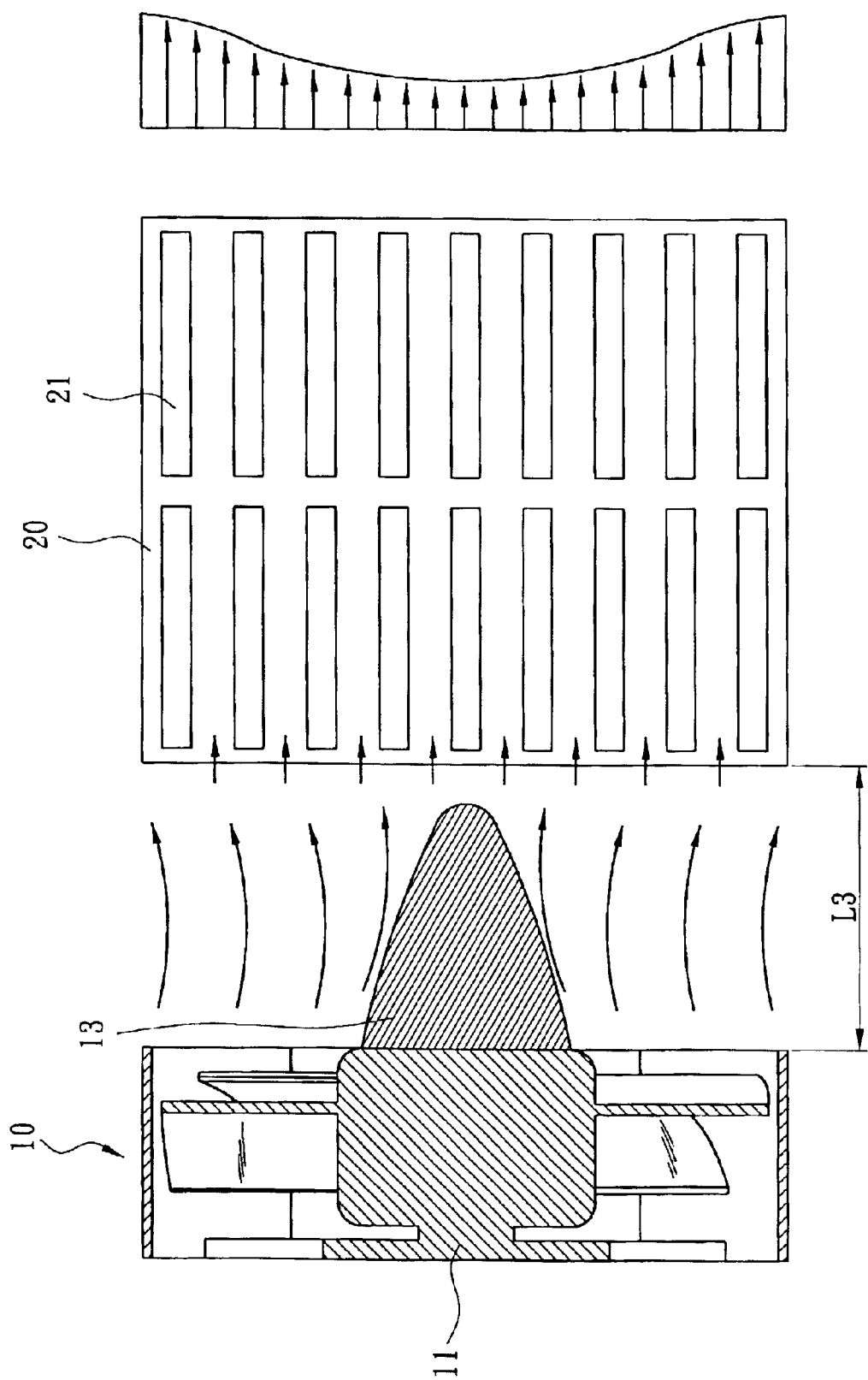
FIG. 4 is a cross section the invention, also showing wind direction when the axial fan rotates.

Referring to FIG. 4, when the invention is in use, the axial fan 10 rotates and draws external air into the device for dispersing heat. Wind generated by the axial fan 10 flows evenly along the nose-shaped spindle tip 13 to the radiator 20 and passes through the radiation fins 21 to carry the heat generated by the processor 30 away and achieve the radiation effect.

Figure 5:
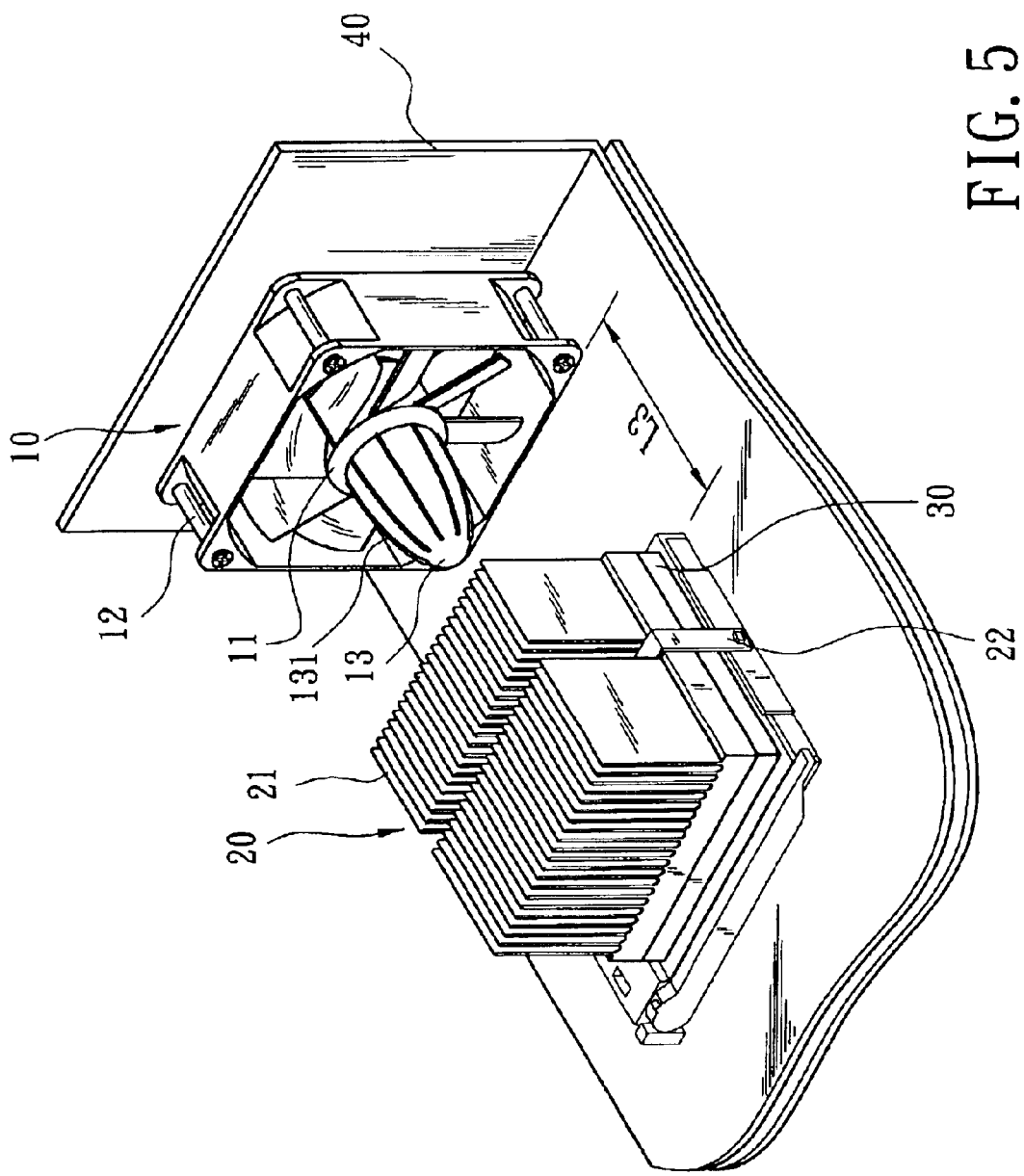
FIG. 5 is a perspective view of another embodiment of the invention.

Refer to FIG. 5 for another embodiment of the invention that also includes a radiator 20 and an axial fan 10 spaced at a distance L3 from each other. The radiator 20 is closely anchored on the processor 30 of the electronic device by means of a coupling element 22 for dispersing heat generated by the processor 30. The radiator 20 has a plurality of radiation fins 21. The radiator 20 has one end facing the axial fan 10 and the other end opposing the axial fan.

The axial fan 10 is mounted to a casing 40 of the electronic device through a plurality of fasteners 12 for drawing external air into the device to disperse heat. The axial fan 10 has a nose-shaped spindle, which has a spindle tip 13 close to the radiator 20. When the axial fan 10 rotates, wind flows evenly along the nose-shaped spindle to the radiator 20. The nose-shaped spindle further has a plurality of guiding vanes 131 formed on the peripheral surface in a direction perpendicular to the rotation of the axial fan 10 for channeling wind direction.

Figure 6:
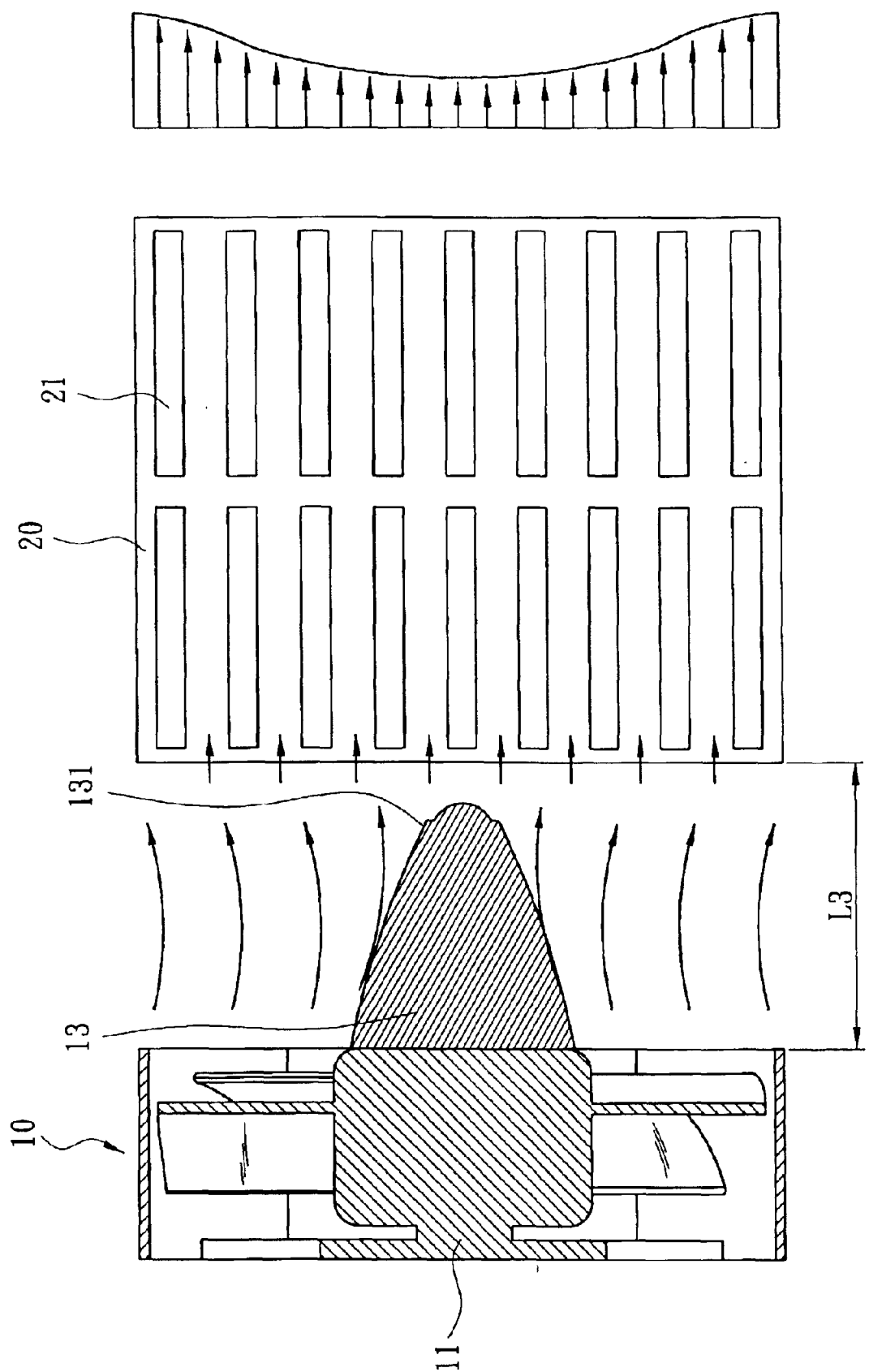
FIG. 6 is a cross section of another embodiment of the invention, also showing wind direction when the axial fan rotates.

Referring to FIG. 6, when the invention is in use, the axial fan 10 rotates and draws external air into the device for dispersing heat. Wind generated by the axial fan 10 flows evenly along the guiding vanes 131 of the nose-shaped spindle to the radiator 20 and passes through the radiation fins 21 to carry the heat generated by the processor 30 away and achieve the radiation effect.

By means of the constructions set forth above, the invention can achieve the following effects:

1. By means of the nose-shaped spindle, wind generated by the axial fan can evenly flow to the radiator, thus preventing reverse air flow (or counter air flow) and overcoming the problem of ineffective radiation.
2. The invention decreases the distance between the axial fan and the radiator, thus reducing the size of the radiator and making the electronic device thinner and lighter.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

It is claimed:

1. A radiation apparatus for dispersing heat from an electronic device, said radiation apparatus comprising:
   a radiator having a plurality of radiation fins; and
   an axial fan including a spindle, said axial fan being located spaced from one end of the radiation fins with an opposite end of the radiation fins being spaced further from the axial fan than said one end, a nose-shaped tip of the spindle projecting into a space between the axial fan and the one end of the radiation fins so that when the axial fan rotates and generates wind, the wind flows evenly along the nose-shaped tip of the spindle to the radiator, the nose-shaped tip of the spindle having a plurality of externally located guiding vanes for channeling wind direction when the axial fan rotates.

2. The radiation apparatus of claim 1, wherein the radiator is bonded to a processor of the electronic device for dispersing heat generated by the processor.

3. The radiation apparatus of claim 1, wherein the axial fan is mounted to a casing of the electronic device for drawing external air into the casing for dispersing heat.

4. The radiation apparatus of claim 2, wherein the radiator includes a coupling element for bonding the radiator to the processor.

5. The radiation apparatus of claim 3, wherein the axial fan includes a plurality of fasteners for fastening the axial fan to the casing.

6. The radiation apparatus of claim 1, wherein the guiding vanes are located on a peripheral surface of the nose-shaped tip of the spindle.

* * * * *